(12) United States Patent
Huang (10) Patent No.: US 9,444,475 B2
(45) Date of Patent: Sep. 13, 2016

(54) OSCILLATOR DEVICE (71) Applicant: Stichting IMEC Nederland, Eindhoven (NL)

(72) Inventor: Xiongchuan Huang, Eindhoven (NL)

(73) Assignee: STICHTING IMEC NEDERLAND, Eindhoven (NL)

( * ) Notice: Subject to any disclaimer, the term of this patent is extended or adjusted under 35 U.S.C. 154(b) by 0 days.

(21) Appl. No.: 14/884,331

(22) Filed: Oct. 15, 2015

(65) Prior Publication Data
US 2016/0118991 A1    Apr. 28, 2016

(30) Foreign Application Priority Data

Oct. 16, 2014  (EP) .................................... 14189226

(51) Int. Cl.
*H03L 5/00*        (2006.01)
*H03B 5/12*        (2006.01)
(Continued)

(52) U.S. Cl.
CPC .................. *H03L 7/24* (2013.01); *H03B 5/124* (2013.01); *H03B 5/1212* (2013.01); *H03B 5/1215* (2013.01); *H03B 5/1228* (2013.01); *H03B 5/1271* (2013.01); *H03B 5/1278* (2013.01); *H03K 3/354* (2013.01); *H03K 5/082* (2013.01); *H03L 5/00* (2013.01)

(58) Field of Classification Search
CPC ........ H03B 5/08; H03B 5/12; H03B 5/1212; H03B 5/1228; H03B 5/1271; H03B 5/30; H03B 5/32; H03B 2201/031; H03L 5/00

USPC ............ 331/15, 109, 116 FE, 116 M, 116 R, 331/117 FE, 117 R, 154, 158, 167, 182, 183, 331/185, 186
See application file for complete search history.

(56) References Cited

U.S. PATENT DOCUMENTS 6,278,338 B1 *  8/2001  Jansson ..................... H03L 5/00
                                                        331/109
6,600,380 B1 *  7/2003  Guggenbuhl .......... G01R 27/02
                                                        331/108 C (Continued)

OTHER PUBLICATIONS

European Search Report, European Patent Application No. 14189226.5, dated Apr. 7, 2015.

(Continued)

*Primary Examiner* — Levi Gannon
(74) *Attorney, Agent, or Firm* — McDonnell Boehnen Hulbert & Berghoff LLP (57) ABSTRACT

An oscillator device comprises an oscillation circuit configured to generate and provide an oscillating signal. A first biasing circuit is configured to derive a bias current signal in accordance with a control signal and apply the bias current signal to the oscillation circuit to control the amplitude level of the oscillating signal. A reference generating circuit is configured to generate a reference voltage signal and comprises a second biasing circuit configured to derive a reference bias current signal in accordance with the control signal. A comparison circuit is configured to determine an error signal by comparing a voltage signal at an output of the first biasing circuit with the reference voltage signal observed at an output of the second biasing circuit. A controller is configured to determine the control signal related to the error signal and provide the control signal to the first biasing circuit and the second biasing circuit.

10 Claims, 9 Drawing Sheets

(51) Int. Cl.
*H03L 7/24* (2006.01)
*H03K 3/354* (2006.01)
*H03K 5/08* (2006.01)

(56) References Cited

U.S. PATENT DOCUMENTS

| | | | | |
|---|---|---|---|---|
| 7,026,883 B2* | 4/2006 | Muthali | ............... | H03B 5/04 331/109 |
| 7,061,338 B2* | 6/2006 | Arigliano | ............ | H03K 5/1565 331/116 FE |
| 8,618,848 B1 | 12/2013 | Chee | | |
| 8,704,605 B1* | 4/2014 | Sinitsky | ................ | H03B 5/362 331/116 FE |
| 8,816,786 B2* | 8/2014 | Tham | ....................... | H03L 5/00 331/109 |
| 2006/0012447 A1* | 1/2006 | Partovi | ............... | H03B 5/1228 331/185 |
| 2008/0238559 A1* | 10/2008 | Kuwano | .............. | H03B 5/1228 331/109 |
| 2011/0193641 A1 | 8/2011 | Clark et al. | | |
| 2013/0271226 A1 | 10/2013 | Sinoussi | | |

OTHER PUBLICATIONS

Fanori, Luca et al., "Highly Efficient Class-C CMOS VCOs, Including a Comparison With Class-B VCOs", IEEE Journal of Solid-State Circuits, vol. 48, No. 7, Jul. 2013, pp. 1-11.

Kinget, Peter, "Amplitude Detection Inside CMOS LC Oscillators", 2006 IEEE International Symposium on Circuits and Systems, ISCAS 2006, May 21-24, 2006, pp. 5147-5150.

* cited by examiner

OSCILLATOR DEVICE

CROSS-REFERENCE TO RELATED APPLICATION

The present application is a non-provisional patent application claiming priority to European Patent Application No. 14189226.5 filed on Oct. 16, 2014, the contents of which are hereby incorporated by reference.

TECHNICAL FIELD

The present disclosure is generally related to the field of oscillators and more specifically to oscillators wherein the oscillation swing can be controlled.

BACKGROUND

In modern communication applications a low noise, highly stable on-chip local oscillator operating at the carrier frequency is indispensable in radio transceivers. Oscillators with a resonant tank, such as LC oscillators and crystal oscillators, are largely adopted because of their high performance and relatively low power consumption, on top of well-studied design trade-offs and methodologies.

An important design parameter of such oscillators is the oscillation amplitude (also called oscillation swing). The oscillation swing has impact on the phase noise and power consumption of the oscillator. It is also related to the way the next stage is driven. For example, when the oscillation signal swing is low, the oscillator operates in the current limited region and the phase noise improves when the oscillator bias current is increased, until the oscillator enters a voltage limited region, where the oscillation signal swing cannot be further increased and the phase noise starts to degrade. In addition, sufficient signal amplitude must be provided to the following oscillator stage, which is typically a frequency divider or a buffer, to ensure proper operation of the system. On the other hand, the oscillator consumes more power for achieving a larger oscillation amplitude. In practical radio systems, the oscillator swing is determined as the trade-off between the power consumption, phase noise and the requirements of the next stage.

To optimize the performance and power consumption, the oscillation swing needs to be tightly controlled. However, the oscillation signal swing depends on a multitude of factors, including process variation of both the active transistors and the passive devices, variations in the supply voltage of the circuits, as well as the ambient temperature. These factors are usually referred to as the process, voltage and temperature (PVT) variations. The targeted oscillation swing obtained by simulation is rarely the same as the actual swing after fabrication. Sometimes, oscillators even fail to oscillate because the loss in the circuit is larger than estimated due to PVT variations. In oscillators with a wide tuning range, there is an additional problem: the oscillation swing changes with frequency, as a result of frequency-dependent LC tank loss and transistor characteristics. In order to leave a sufficient margin, circuit designers often leave a margin during the design, so that the oscillation signal swing is larger than necessary, with consequently higher power consumption than optimum.

Figure 1:
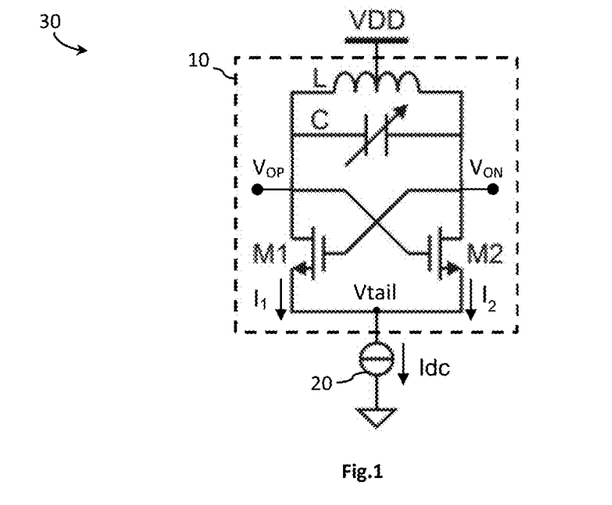
FIG. 1 illustrates a conventional resonant oscillator based on LC tank resonator and NMOS cross-coupled transistor pair and a tail current source.

FIG. 1 shows a typical cross-coupled LC oscillator. It contains a passive resonance tank, which can be a parallel LC tank, and a differential transconductor with a tail current source Idc. The LC tank resonates at the desired oscillation frequency, while the transconductor compensates the LC tank loss so that the oscillation can be excited and maintained. The oscillator output signal approaches an ideal sinusoid wave at the resonance frequency. With ideal linear transconductors the oscillation signal swing will grow exponentially over time without bound, which means the oscillation signal swing will approach infinity as time elapses. In reality, due to non-linearity in transistors, the oscillation signal swing is limited by the voltage supply and bias conditions.

More in particular, FIG. 1 shows an LC oscillator based on a NMOS cross-coupled topology. The oscillator 30 comprises a resonance tank 11 and active circuit 12 containing a pair of NMOS transistors M1, M2 and a tail current source 20 which provides a bias current Idc to the transistor pair M1, M2. When oscillation starts, the oscillation amplitude at the output nodes of the oscillator $V_{ON}$,$V_{OP}$ increases, and the signal levels upon the NMOS transistors also increase, i.e. the gate-source voltage amplitudes on M1 and on M2. Due to the non-linearity of the transistors M1 and M2, the amplitude of the voltage $V_{tail}$ at the tail current source output will increase together with the oscillation amplitude. Therefore, an indication of the high frequency oscillation signal amplitude at the oscillator output is obtained at low frequency from the voltage level of the tail current 20 used for biasing the active transistors. This avoids the usage of additional circuits connected to the output of the oscillator 30 as in conventional designs, where an envelope detector is connected to the output of oscillation circuit $V_{ON}$,$V_{OP}$, and in turn to the resonance tank 11. The drawback of adding a dedicated envelope detector to the resonance tank 11 is that the input impedance of the envelope detector becomes an extra load for the tank. The resistive loading of the envelope detector degrades the Q-factor of the tank and increases noise and power consumption of the oscillator, while its capacitive loading alters the resonance frequency of the oscillator and degrades the frequency tuning range. In addition, the envelope detector consumes extra power which adds to the overall system power consumption.

The transconductor shown in FIG. 1 is built with NMOS transistors, but it can be replaced by PMOS transistors, or N- or P-type bipolar transistors. Several alternative topologies are available.

Hence, in summary, the conventional approach to obtain the oscillation signal swing is to attach an envelope detector to the oscillator output. Since the envelope detector is connected to the oscillator output, which directly loads the resonance tank, the input impedance of the envelope detector becomes an extra load to the oscillator resonance tank. The resistive loading of the envelope detector degrades the Q-factor of the resonance tank and increases the oscillator's noise and power consumption, while the capacitive loading alters the oscillator resonance frequency and degrades the frequency tuning range. These problems are even more severe in RF applications since the oscillators are increasingly sensitive to parasitics at higher frequencies. In addition, the envelope detectors consume extra power which adds to the overall system power consumption.

The paper "*Highly Efficient Class-C CMOS VCOs, Including a Comparison With Class-B VCOs*" (L. Fanori & P. Andreani, IEEE Journal Solid-State Circuits, vol. 48, no. 7, July 2013, pp. 1730-1740) presents two class-C Voltage Controlled Oscillators with a dynamic bias of the core transistors, which maximizes the oscillation amplitude without compromising the robustness of the oscillation start-up. In this way it provides a solution to the well-known trade-off encountered in a class-C VCO. To detect the start-up of oscillation the tail current voltage is used.

The paper "*Amplitude detection inside CMOS LC oscillators*" (P. Kinget, IEEE Int'l Symposium on Circuits and Systems 2006) demonstrates that an intrinsic amplitude detector exists in negative resistance CMOS LC oscillators. The DC bias on the common-mode node in CMOS VCOs depends on the oscillation amplitude. The paper describes how this DC bias (i.e. the tail current voltage) can be used as an intrinsic detector for the oscillation amplitude.

However, what is missing in the prior art solutions is that the oscillator device design should take into account that the local oscillator swing is influenced by process, voltage and temperature variations. Consequently, there is a need for an appropriate way to monitor the output swing and to regulate it.

SUMMARY

It is an object of embodiments of the present disclosure to provide for an oscillator device wherein the oscillation swing is controllable, so that process, voltage and temperature variations can be properly dealt with, while avoiding the use of an envelope detector. This objective is accomplished by the solution according to the present disclosure.

In a first aspect, the disclosure relates to an oscillator device that includes an oscillation circuit configured to generate and provide an oscillating signal, and a first biasing circuit configured to derive a bias current signal in accordance with a control signal and apply the bias current signal to the oscillation circuit to control the amplitude level of the oscillating signal. In this aspect, the oscillator device also includes a reference generating circuit configured to generate a reference voltage signal and comprising a second biasing circuit configured to derive a reference bias current signal in accordance with the control signal. Further, this oscillator device also includes a comparison circuit configured to determine an error signal by comparing a voltage signal observed at an output of the first biasing circuit with the reference voltage signal observed at an output of the second biasing circuit, and a controller configured to determine the control signal related to the error signal and provide the control signal to the first biasing circuit and the second biasing circuit.

The proposed solution indeed allows for taking into account PVT variations. The reference generation circuit is so biased that the voltage at its output represents the desired oscillation amplitude. The voltages at the tail current sources of the oscillator and the reference generation circuit, respectively, are compared to determine an error signal, from which an adaptation signal is derived. When the oscillator is influenced by PVT variations, the reference generation circuit is also influenced by the same PVT variations, and therefore the uncertainty caused by PVT variations is reduced or even cancelled out in the oscillator-reference generation circuit combination. Consequently, the oscillation amplitude can be precisely controlled in spite of changing PVT conditions.

In a preferred embodiment, the oscillation circuit comprises a resonant tank. This may be a LC tank, a crystal resonator or a MEMS resonator.

Preferably the first biasing circuit and the second biasing circuit comprise a current source.

In one embodiment a first rail voltage is applied to the oscillating circuit. A second rail voltage is applied to the first biasing circuit.

In another embodiment the oscillator device further comprises an interfacing circuit configured to receive the control signal and provide an adapted control signal to the first biasing circuit and optionally also to the second biasing circuit.

In one embodiment the controller is configured to run a control algorithm, preferably a PID control algorithm.

In another embodiment the oscillator device further comprises an analog-to-digital converter for digitizing the error signal and a digital-to-analog converter for converting the control signal.

In another embodiment the oscillator device further comprises a low-pass filter for filtering the voltage signal.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

Example embodiments will now be described further, with reference to the accompanying drawings, wherein like reference numerals refer to like elements in the various figures.

DETAILED DESCRIPTION

The present disclosure will be described with respect to particular embodiments and with reference to certain drawings but the disclosure is not limited thereto but only by the claims.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

An oscillator device comprises a resonant oscillator circuit, which is typically composed of a passive resonant tank and an active circuit. The resonant tank resonates at a frequency determined by the time constant of the tank, while the active circuit compensates the energy loss of the resonant tank so that resonance can be maintained. Once the resonance is excited and maintained, the circuit is oscillating.

The oscillation amplitude (swing) is determined by the supply voltage, transistor characteristics, oscillator topology and biasing of the active circuit. Because of process, voltage and temperature (PVT) variations, the amplitude of oscillation cannot be accurately predicted. On the other hand, to meet the desired performance and power budget, it is necessary to detect and control the oscillation amplitude at a predefined level.

The technique according to the present disclosure requires no dedicated envelope detectors to monitor the output signal swing of an oscillator. Rather, it makes use of the built-in envelope detection operation in the oscillator itself, which occurs in the active transistors M1, M2 (see FIG. 1). The tail current source 20 has a high output impedance, so that the voltage Vtail over the tail current source is determined by transistors M1, M2 and their drain current. The envelope detection effect in M1 and M2 is based on the 2nd-order non-linearity of the current-voltage relationship in the transistors M1 and M2. When the oscillation amplitude increases, the average gate-source voltage of M1 and M2 reduces, which pulls the DC level of the signal Vtail higher. It is vice versa when the oscillation amplitude decreases. In other words, the oscillation signal at the oscillator output is generated through the active transistor(s) M1, M2 which exhibit 2nd-order non-linearity under a large signal drive. The high DC impedance of the tail current source 20 allows the tail voltage Vtail not directly influenced by the tail current source, but determined by the oscillation amplitude only. The signal Vtail can be compared to a reference voltage generated by, for example, a reference circuit.

The oscillation amplitude of the oscillator 30 in FIG. 1 can be adjusted via the tail current Idc of the current source 20 of the oscillator. If the tail current Idc is increased, the oscillation amplitude will increase; if the tail current Idc is decreased, the oscillation amplitude will decrease. This effect is used to adjust the oscillation amplitude at the oscillator output.

Figure 2:
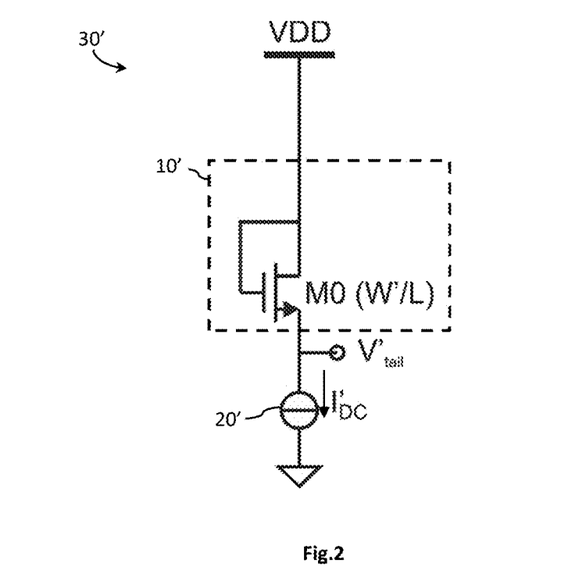
FIG. 2 illustrates a reference generation circuit based on an NMOS transistor and a tail current source.

To compare the detected oscillation amplitude to a desired oscillation amplitude, a reference generation circuit 30' is used as shown in FIG. 2. The topology of the reference generation circuit 30' is the same as the DC signal path of the oscillator. The reference circuit 30' comprises a transistor M0 and a current source 20', which outputs a bias current Idc' for the biasing of transistor M0. The biasing of the reference generation circuit, which is dependent on the size W'/L of transistor M0' and the tail current source Idc', is determined in such a way that the voltage V'tail at the output of the tail current source represents the desired oscillation amplitude. By comparing the voltages at the tail current sources 20, 20' of the oscillator 30 and the reference generation circuit, i.e., Vtail and V'tail, it can be deduced whether the oscillation amplitude at the output nodes $V_{OP}$, $V_{ON}$ of the oscillation circuit 30 is smaller or larger than the desired amplitude.

Figure 3:
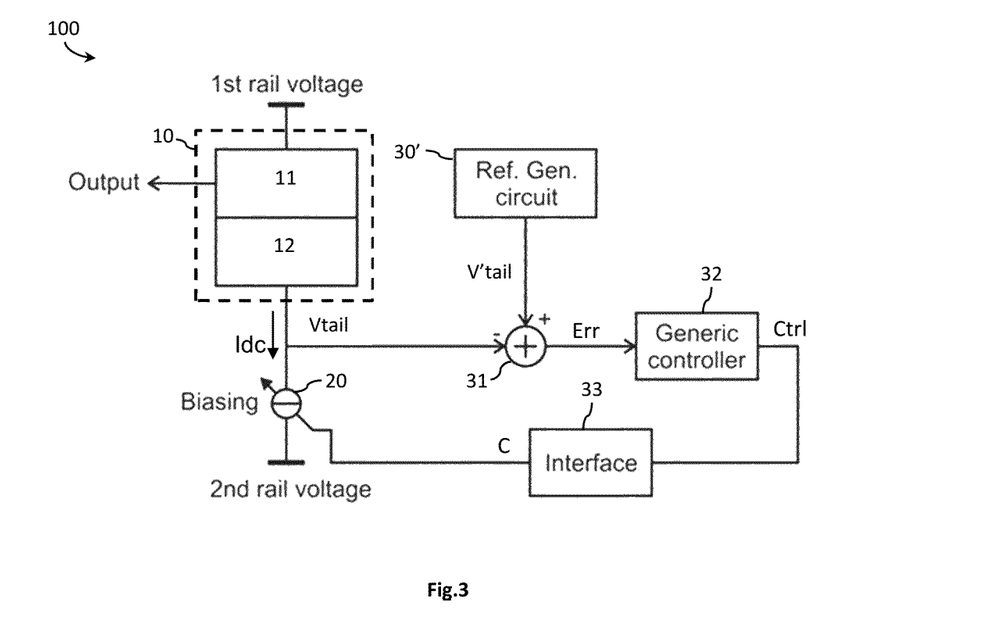
FIG. 3 illustrates a block scheme of an oscillator device with automatic amplitude control (AAC) loop according to an embodiment of the present disclosure.

FIG. 3 illustrates a block diagram of the proposed oscillator device 100 employing a feedback loop for an automated control of the amplitude (herein referred as an AAC loop) of the output oscillation signal. Based on the comparison between the detected oscillation amplitude and the desired amplitude, the automatic amplitude control (AAC) loop ensures the amplitude at the oscillator output is the same as the desired amplitude. As described above, the signal Vtail at the output of the current source 20 of the oscillator 30 indicates the amplitude of the output oscillation signal. Similarly, the signal V'tail at the output of the current source 20' of the reference circuit 30 indicates the desired amplitude. The detected oscillation amplitude (through the voltage Vtail) and the desired amplitude (through the voltage V'tail) are subtracted in a subtraction circuit 31. The subtraction circuit 31 may be, for example, a comparator, a differential amplifier, a differential analog-to-digital converter (ADC) or a similar circuit. From the difference between Vtail and V'tail an error signal Err is determined. The error signal Err is then applied to a controller 32 which determines how to adjust the oscillator amplitude by adjusting the current source 20. The controller output Ctrl is used to control the tail current source of the oscillator 30, through an optional interfacing circuit 33. The interfacing circuit may be embedded in the controller or in the biasing circuit 20. The interfacing circuit converts the controller output signal Ctrl into a control signal C which can be accepted by the tail current source 20. For example, the controller output Ctrl can be a voltage signal and an interface circuit 33 can convert this voltage signal into a current signal, which is then copied to the tail current source 20 via current mirroring. In another example the controller output signal Ctrl is a digital signal and the interface circuit 33 can convert this digital signal into an analog voltage or current, which in turn controls the tail current source 20.

The control circuit 32 aims at reducing the difference between the actual amplitude and the desired amplitude by means of a control algorithm. In general, the controller 32 operates based on a negative feedback principle. When the actual detected amplitude is larger than the desired amplitude, the controller output reduces the oscillation amplitude. When the actual amplitude is smaller than the desired signal, the controller output increases the oscillation amplitude. Therefore, the actual oscillation amplitude will get closer to the desired amplitude due to the operation of the controller 32. The controller algorithm can be a proportional-integral-derivative (PID) control algorithm, or any variant of the PID controller. For a solely proportional control algorithm the controller output Ctrl is proportional to the error signal Err at the controller input. For a solely integral control algorithm the controller output Ctrl is proportional to the integral of the error signal Err at the controller input, i.e., based on the accumulation of the error signal. For a solely derivative control algorithm the controller output is proportional to the derivative of the error signal at the controller input, i.e., based on the rate of change in the error signal. These three control algorithms can be combined in any configuration, or used separately.

When the tail current source 20 in the oscillator 30 is adjusted with the control signal Ctrl or with the converted control signal C which can be accepted by the tail current source 20, the oscillator amplitude changes accordingly. The tail current source can be adjusted in various ways. For example, if the tail current source is implemented as a MOS transistor, then the tail current is controlled by the gate-source voltage signal. If the tail current source is based on a current mirror, then the current can be controlled by a reference current signal. If the tail current source is composed of an array of switchable unit current sources (e.g. switchable transistors), then the tail current can be adjusted by a digital signal to control the switching of the respective unit current sources. The present disclosure proposes to adjust the tail current source 20' in the reference circuit 30' accordingly, so that the reference generation circuit 30' matches the biasing condition of the oscillator, and the variations on PVT have a similar effect on the reference voltage V'tail and the detection voltage Vtail. Consequently, the AAC loop is less sensitive to PVT variations and the oscillation amplitude can be controlled more accurately.

Ideally, the adjustment of the tail current source 20 in the reference circuit should be proportional to the adjustment of the tail current source in the oscillator circuit to enable the optimal compensation of PVT variations. The amplitude control loop allows fast start-up of the oscillator since at the beginning of the start-up phase, the loop detects the deficiency in the amplitude and thus increases the bias current, which in turn speeds up the amplitude build-up. When the oscillation amplitude reaches the target amplitude, the loop detects the excess in the amplitude and thus reduces the bias current, which reduces the oscillator power consumption after the oscillator is stabilized. Similarly, since the amplitude control loop is able to detect the insufficiency in the amplitude, it will guarantee the oscillator successfully starts despite of PVT variations.

The amplitude control loop also allows flexible, on-demand control of the oscillator. For example, for high performance applications, where higher oscillation amplitude is required, the target oscillation amplitude can be set higher via the reference circuit, so that the loop ensures a high amplitude in the oscillator. For low performance applications, where lower oscillation amplitude can be used, the target oscillation amplitude can be set lower via the reference circuit, so that the loop ensures a lower amplitude in the oscillator and consequently reduces the oscillator power consumption.

Figure 4:
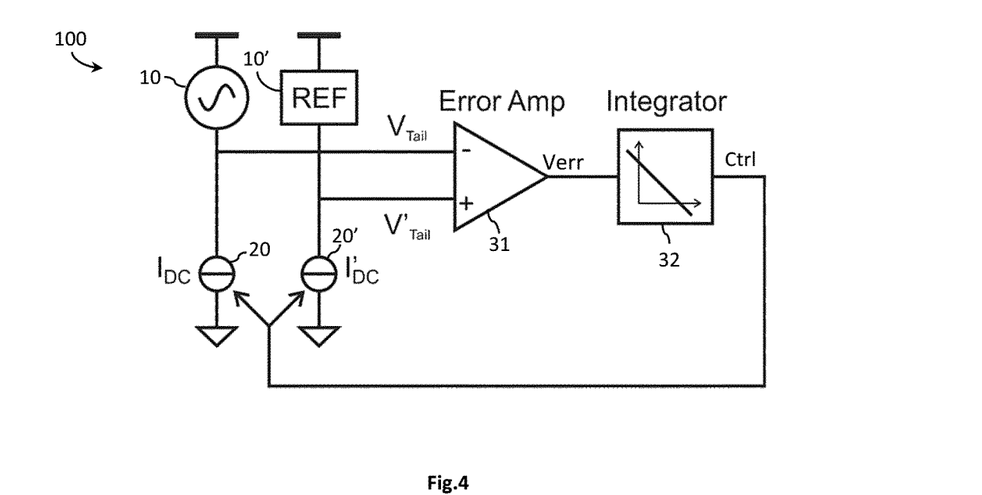
FIG. 4 illustrates an embodiment of an oscillator AAC loop with an oscillator, a reference circuit, an error amplifier and an integrator as an integral controller.

An example of oscillator circuit with AAC loop is shown in FIG. 4. Firstly, the detected voltage Vtail and reference voltage V'tail is compared in an error amplifier 31, which outputs an error signal Err. In this implementation, the error signal is a voltage signal Verr representing the voltage difference of Vtail and V'tail. This error signal is then integrated by an integrator 32, which acts as an integral controller. The integrator outputs a control signal Ctrl (i.e. a voltage signal Vctrl), which is used to control the bias current of the oscillator and reference generator directly, without an explicit interface circuit 33. For example, when the oscillation swing is larger than the reference swing, Vtail is higher than V'tail. Consequently, the error amplifier output Err is negative, which reduces the output of the integrator 32. As the integrator output decreases, the bias current Idc of the oscillator is decreased, thus reducing the output signal swing of the oscillator. Eventually, due to the negative feedback operation, the amplitude difference between Vtail and the reference signal V'tail will be reduced to zero and the oscillation signal swing will approach the reference swing.

Figure 5:
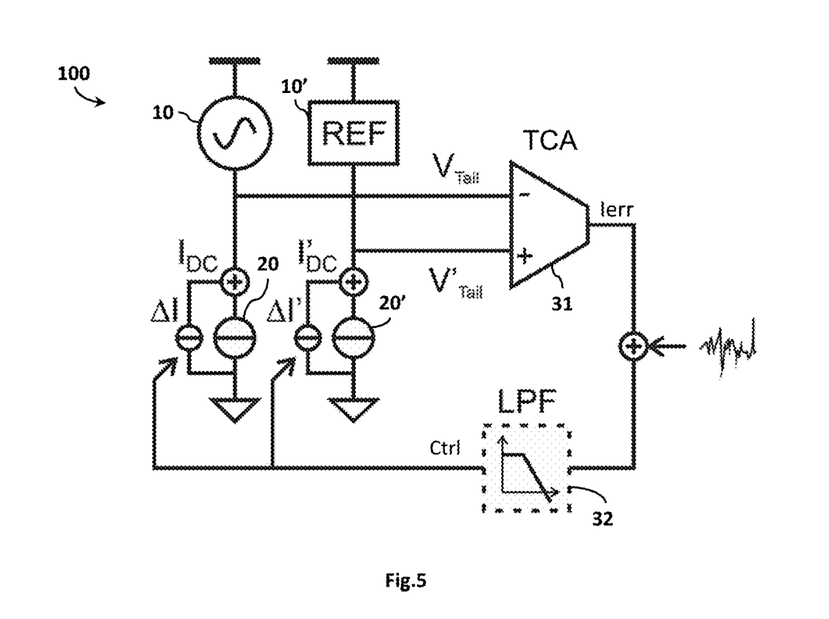
FIG. 5 illustrates an embodiment of an oscillator AAC loop with an oscillator, a reference circuit, an ADC, a digital accumulator and a DAC.

FIG. 5 shows an example of analog implementation. The detection signal and the reference signal are applied to the differential input of a transconductance amplifier (TCA) 31. The error signal Err at the output of the amplifier 31 is a current signal representing the difference between these two voltages converted into a current. The current signal Ierr is mirrored to two scaled offset currents ΔI and ΔI', one ΔI added to the oscillator bias current $I_{DC}$, the other ΔI' added to the reference circuit bias current $I'_{DC}$. Optionally, a low pass filter (LPF) may be added to reduce the bandwidth of the feedback loop and to ensure the stability. One of the drawbacks of this analog implementation is the noise injected by the active circuits in the feedback loop, i.e. the TCA and/or the LPF, degrades the phase noise of the oscillator 30. Typically an oscillator is quite sensitive to the noise from its tail current source, so the noise performance of the circuits in the feedback loop must be optimized to reduce their impact on the phase noise of the oscillator. This inevitably results in higher power consumption of the feedback loop. Another shortcoming of the analog implementation is that the feedback loop cannot be switched off easily. When the desired oscillation signal swing is set, the feedback loop should be switched off to conserve power. However, the adjustments in the bias currents Idc,Idc' are analog quantities, which must be maintained by an operating feedback loop.

Figure 6:
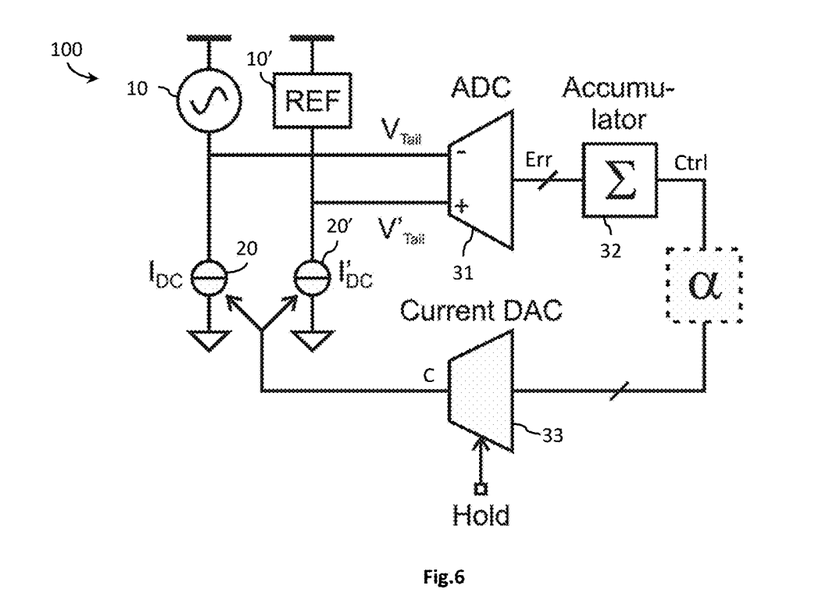
FIG. 6 illustrates an embodiment of an oscillator AAC loop with an oscillator, a reference circuit, a comparator, a digital accumulator and a DAC.

The feedback loop of FIG. 3 can also be implemented in the mixed-signal domain. FIG. 6 shows an example of a mixed signal implementation. The oscillator 30 and reference generation circuit 30', and their tail current sources are in the analog domain. The subtracting circuit 31 is a multi-bit analog-to-digital converter (ADC), which converts the difference of amplitude between the analog input signals Vtail and V'tail into a digital signal Err. The controller, which in this case is an integral controller, is a digital accumulator. The interface circuit is a digital-to-analog converter (DAC) that converts the digital output Ctrl of the controller to an analog current signal which can be accepted by the tail current sources in the oscillator and the reference circuit. The detected signal Vtail and the reference signal V'tail are taken differentially by the analog-to-digital converter, which serves as a subtraction circuit. The ADC digitizes the difference between Vtail and V'tail into a digital error signal Err. The digital error signal is then accumulated by an accumulator 32, which serves as an integral controller in a digital fashion. The accumulator result Ctrl is used to control a digital-to-analog converter (DAC) 33, which serves as the interface circuit between the controller 32 and the tail current sources 20 and 20'. Optionally, the Ctrl signal may be scaled by a scaling circuit which applies a scaling factor α to the control signal before the interface DAC circuit. The scaling of the control signal adjusts how fast the amplitude difference is adjusted, i.e. how fast the error signal is brought close to zero. The scaling circuit may be integrated in the accumulator. The benefit of the mixed-signal approach is that the loop is almost noise immune. The only two places that noise can inject in the AAC feedback loop are the ADC and the DAC. Numerous DAC circuit implementations already exist with minimized noise. During analog-to-digital conversion, the ADC introduces quantization noise, which causes the accumulator output to flip between different levels, which in turn causes the oscillation swing to dither around the desired amplitude level. To solve this problem, the feedback operation can be disabled once the oscillator signal swing is close enough to the desired level. This can be done by holding the digital input of the DAC, so that the oscillator bias current is kept unchanged. At this moment, the other circuits in the feedback loop, including the ADC, the accumulator and the scaling circuit α, as well as the reference circuit can be switched off completely to reduce power consumption.

The implementation in FIG. 6 can be simplified by using a comparator instead of an ADC to calculate the error signal Err. Herein, instead of using a multi-bit ADC to detect the difference between Vtail and V'tail, a comparator 31 may be used instead to determine which signal is higher. In such implementation the comparator serves as a 1-bit ADC, which generates a higher quantization noise compared to the multi-bit ADC.

Figure 7:
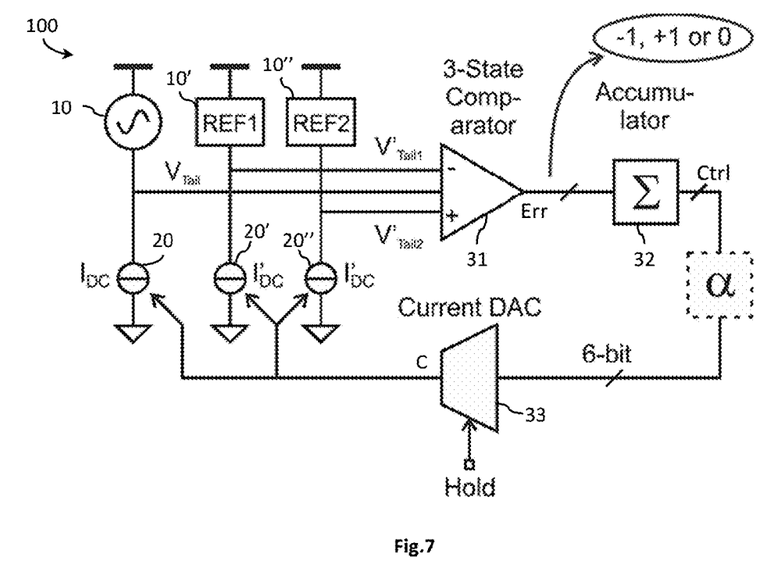
FIG. 7 illustrates an embodiment of oscillator AAC loop with an oscillator, two reference circuits, a 3-state comparator, a digital accumulator and a DAC.

FIG. 7 shows a modified implementation of the mixed-signal AAC loop of FIG. 6. Different from the comparator feedback implementation shown in FIG. 6, the realization of FIG. 7 uses two reference generator circuits 30' and 30" each comprising a current source 20',20". Each reference generating circuit generates a reference voltage (V'tail1 and V'tail2, respectively), which define an upper and a lower bound of the desired oscillation swing. For example, the V'tail1 is the higher bound (V'tail1>V'tail2). A 3-state comparator 31 is used to compare Vtail to the two reference voltages V'tail1 and V'tail2 and to output an error signal Err which indicates if Vtail is below the lower bound V'tail2, above the higher bound V'tail1 or within the lower and upper bounds. The comparator output Err then is:

$$C_{OUT} = \begin{cases} -1, & \text{when } V_{Tail} > V'_{Tail1}; \\ 0, & \text{when } V'_{Tail2} < V_{Tail} < V'_{Tail1}; \\ 1, & \text{when } V_{Tail} < V'_{Tail2}; \end{cases}$$

Once Vtail is between V'tail1 and V'tail2, the error signal Err at the comparator output equals zero. Until the amplitude of the oscillator signal is within the upper and lower bounds, the control signal Ctrl at the output of the accumulator is maintained constant. As the accumulator output does not flip between different levels, the oscillation swing hence does not dither around the desired amplitude level. Using a three-state comparator avoids the accumulator output flipping between two values as in FIG. 6 once the desired amplitude is reached. The oscillator bias current is thus stabilized once the oscillation swing is within the preset upper and lower bounds.

The proposed AAC feedback loop can be applied to various oscillator circuits comprising a resonance tank and a current source. The low frequency voltage across the current source is the Vtail signal used as amplitude detection signal. The reference generator circuit 30' needs to be a replica of the employed oscillation circuit. The corresponding reference circuit 30' should be constructed with the same DC current path, the same biasing condition or a modified biasing condition as the oscillator circuit 30. The resonance tank 11 may be for example an LC tank, a crystal resonator, a micro-machined (MEMS) resonator, etc. Several examples of different oscillators and their respective reference generation circuits are shown in FIG. 8 to FIG. 12.

Figure 8:
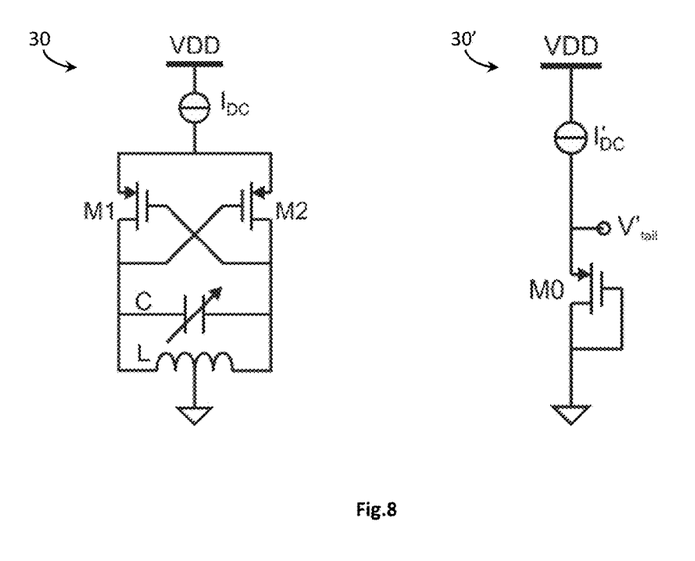
FIG. 8 illustrates a resonant oscillator based on LC tank resonator and PMOS cross-coupled transistor pair and a tail current source, and a reference generation circuit based on a PMOS transistor and a tail current source.

FIG. 8 illustrates a typical resonant oscillator 30 based on LC tank resonator and NMOS cross-coupled active transistor pair and a P-type tail current source, as well as a reference generation circuit 30' based on a NMOS active transistor and a P-type tail current source.

Figure 9:
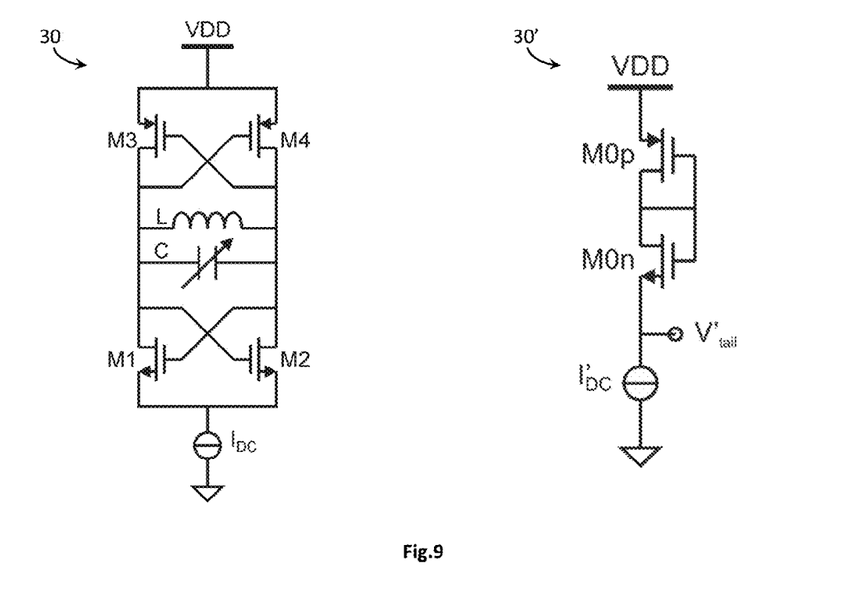
FIG. 9 illustrates a resonant oscillator based on LC tank resonator and NMOS & PMOS double cross-coupled transistor pair and a tail current source, and a reference generation circuit based on an NMOS and a PMOS and a tail current source.

FIG. 9 illustrates a typical resonant oscillator based on LC tank resonator and NMOS & PMOS double cross-coupled active transistor pair and a tail current source, as well as a reference generation circuit based on an NMOS and a PMOS active transistors and a tail current source.

Figure 10:
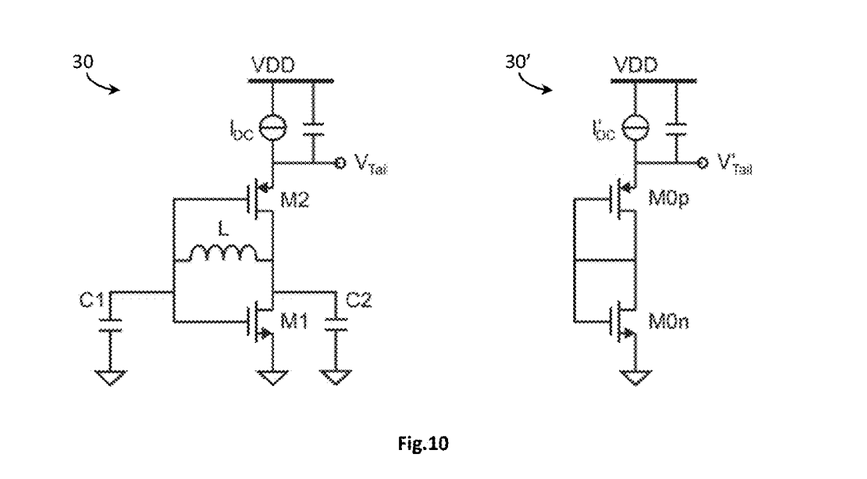
FIG. 10 illustrates a resonant oscillator based on LC tank resonator and NMOS & PMOS transistors and a tail current source, and a reference generation circuit based on an NMOS and a PMOS transistor and a tail current source.

FIG. 10 illustrates a typical resonant oscillator based on LC tank resonator and NMOS & PMOS active transistors and a tail current source, as well as a reference generation circuit based on an NMOS and a PMOS active transistors and a tail current source.

Figure 11:
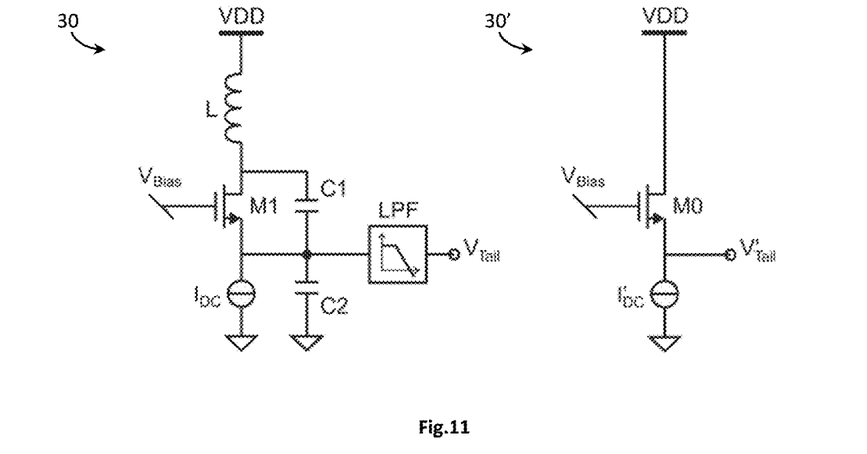
FIG. 11 illustrates a resonant oscillator based on LC tank resonator and an NMOS transistor and a tail current source, and a reference generation circuit based on an NMOS transistor and a tail current source.

FIG. 11 illustrates a typical resonant oscillator based on LC tank resonator and an NMOS active transistor and a tail current source, as well as a reference generation circuit based on an NMOS active transistor and a tail current source. Since the voltage at the tail current source contains also the high frequency oscillation signal, a low-pass filter (LPF) is added to suppress the oscillation signal and keep only the low-frequency signal as Vtail as the signal holding information on the detected oscillation amplitude.

Figure 12:
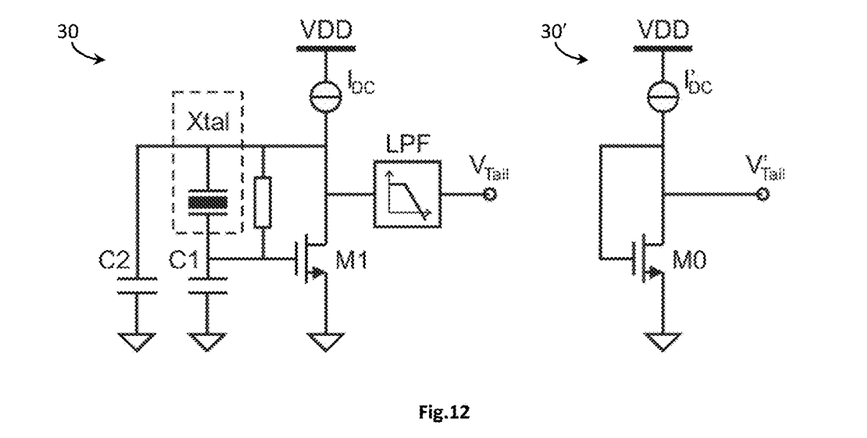
FIG. 12 illustrates a resonant oscillator based on crystal resonator and NMOS transistor and a tail current source, and a reference generator circuit based on an NMOS transistor and a tail current source.

FIG. 12 illustrates a typical resonant oscillator 30 based on crystal tank resonator and an NMOS active transistor and a tail current source, as well as a reference generation circuit 30' based on an NMOS transistor and a tail current source. Similarly to the oscillator of FIG. 11, in this implementation the voltage at the tail current source contains also the high frequency oscillation signal. Hence, a low-pass filter (LPF) is added to suppress the oscillation signal and keep only the low-frequency signal as Vtail as the signal holding information on the detected oscillation amplitude.

Figure 13:
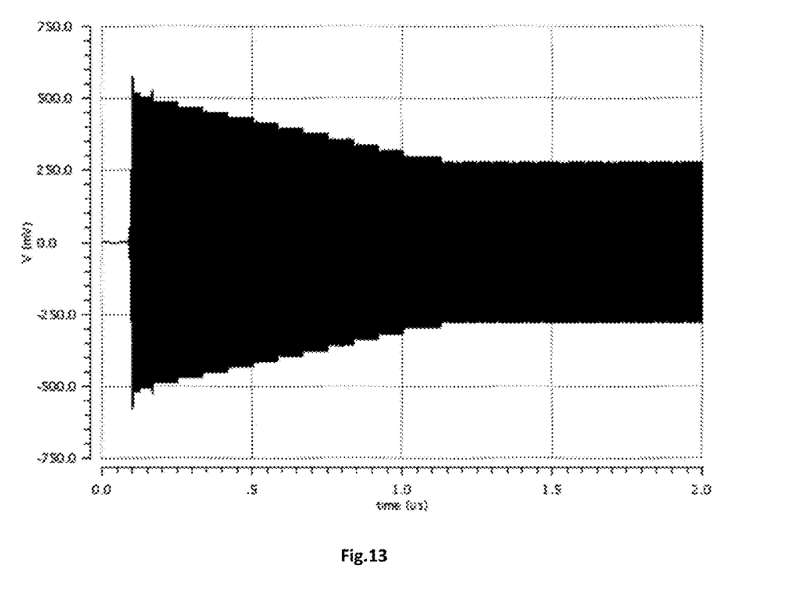
FIG. 13 illustrates transient waveforms of the differential output signal of the oscillator with an active AAC loop.
Figure 14:
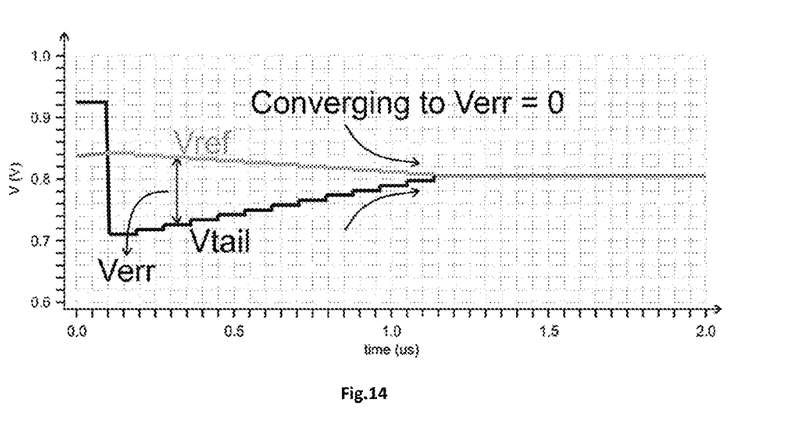
FIG. 14 illustrates transient waveforms of the amplitude detection signal Vtail and reference signal Vref (V'tail) with an active AAC loop.

A test circuit has been built up following the implementation shown in FIG. 4 and simulated to confirm the operation of the proposed oscillator amplitude detection and control loop. FIG. 13 to FIG. 17 shows the transient simulation result. At the beginning (t<200 ns), the oscillator 30 just starts to oscillate. Since the oscillation swing at this moment is very low (almost zero), the difference between Vref (V'tail) and Vtail is negative (i.e. the error signal Verr<0) as shown in FIG. 14. The controller 31 detects the insufficiency in amplitude level of the oscillation signal, and through its control algorithm, it adjusts through the interface circuit 33 the current source 20 of the oscillator 30 to increase the tail current 20 as well as the tail current source 20' of the reference circuit 30'. After the oscillation has built up around 200 ns (FIG. 13), the oscillation swing (the oscillation amplitude) exceeds the target, which is 250 mV. The difference between Vref (V'tail) and Vtail is positive (Verr>0) as shown in FIG. 14, and the controller detects the excess in the oscillation amplitude. The control algorithm then reduces the oscillator biasing gradually via the interface circuit to reduce the oscillation amplitude to 250 mV as shown in FIG. 13. The amplitude decreases until the point where it is equal to the desired amplitude (250 mV) around 1.1 us. At this point, the amplitude of Vtail and Vref (V'tail) are almost the same (Verr≈0) as shown in FIG. 14. When the controller 31 detects the error signal Verr being close to zero, it knows that the oscillator amplitude reaches the desired level, and its algorithm maintains the current bias level of the oscillator. From this point on, the oscillator amplitude is stabilized around the desired amplitude.

Figure 15:
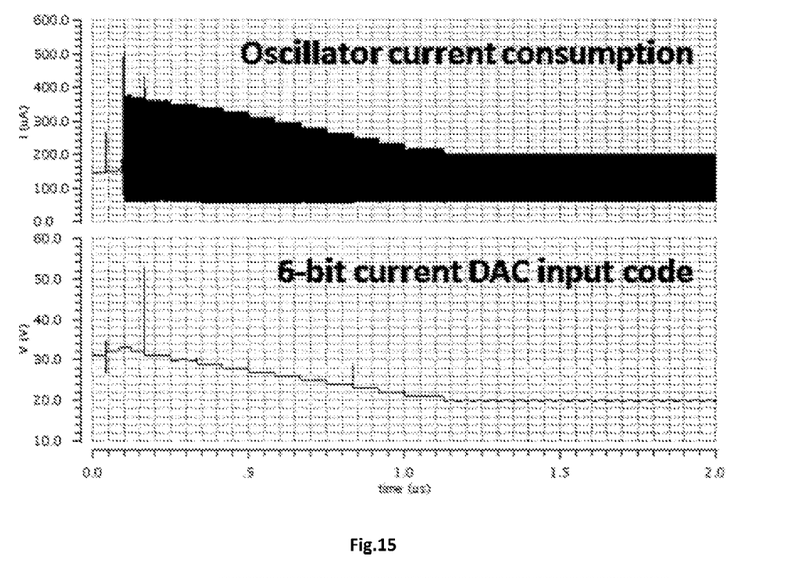
FIG. 15 illustrates transient waveforms of the current consumption and controller 31 output signal (Vctrl) with an active AAC loop.

FIG. 15 shows the simulated oscillator device current consumption and the biasing control input. It can be seen that as a result of AAC loop operation, the current consumption of the oscillator device scales as the amplitude is regulated.

Figure 16:
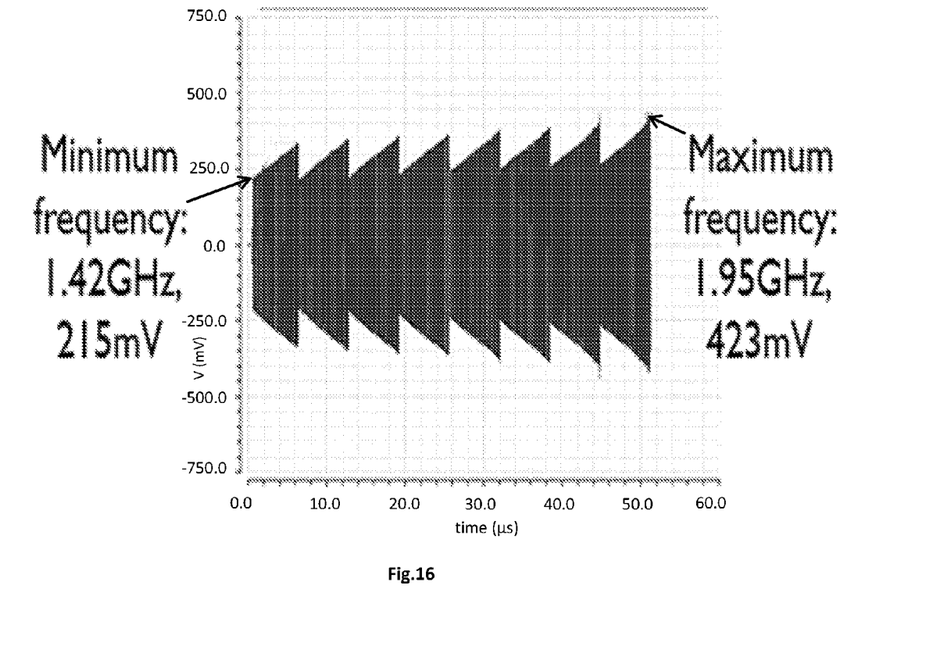
FIG. 16 illustrates transient waveform of the differential output signal of the oscillator without an active AAC loop when the oscillation frequency is swept.
Figure 17:
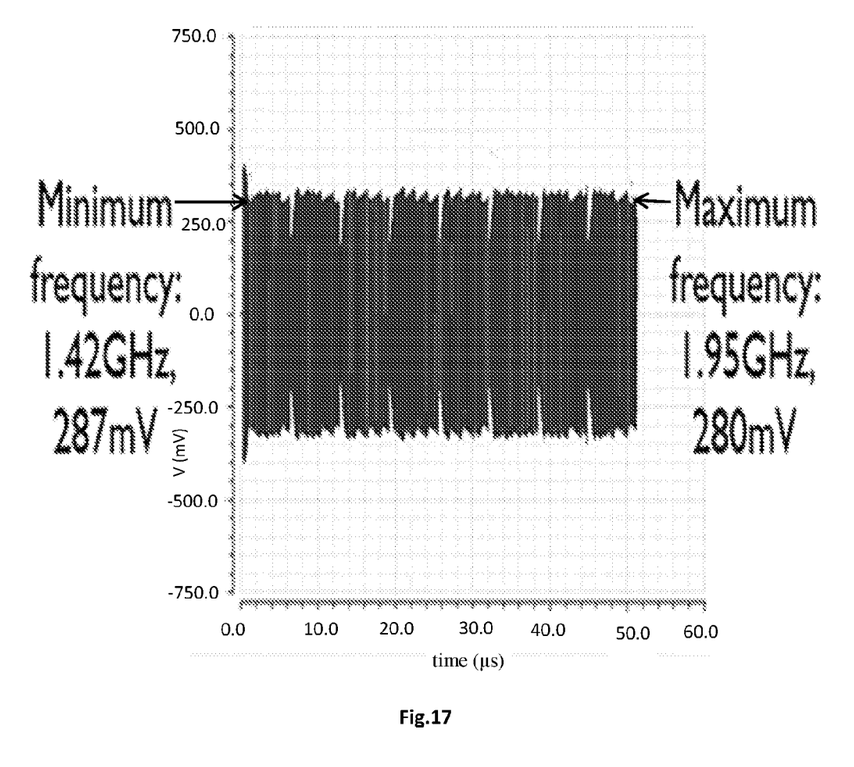
FIG. 17 illustrates transient waveform of the differential output signal of the oscillator with an active AAC loop when the oscillation frequency is swept.

FIG. 16 and FIG. 17, respectively, show the transient waveforms of the oscillation signal when the frequency of the oscillator is swept from minimum to maximum. In this simulation, the oscillator can be tuned from 1.42 GHz to 1.95 GHz. FIG. 16 shows the transient waveforms of the oscillation signal when the AAC loop is deactivated, i.e. the bias current of the oscillator is fixed across the frequency range. Due to different LC tank impedance at different resonance frequencies, the oscillator amplitude varies considerably across the frequency tuning range. As shown in the figure, at 1.42 GHz, the oscillator swing is 215 mV, while at 1.95 GHz, the swing increases by almost 100% to 423 mV. The sawtooth shape of the signal envelope is because the frequency is tuned in overlapping curves. FIG. 17 shows the transient waveform of the oscillator when the AAC loop is activated. It can be seen that across the tuning range, the swing stays relatively constant: at 1.42 GHz, the swing is 287 mV, while at 1.95 GHz, the swing is 280 mV, with only 2.5% mismatch.

The oscillator device employing the described AAC loop offers a number of advantages. It guarantees the start-up of the oscillator and ensures the desired oscillation amplitude is reached despite PVT variations. It allows an on-demand and flexible control of the oscillator amplitude by adjusting the biasing condition of the oscillator during the start-up phase for a fast start-up or during normal operation to maintain the desired oscillator amplitude across different operating frequencies. Further, the amplitude of the oscillator signal can be easily set to a predefined level at which the oscillator device phase noise is optimal.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. An oscillator device comprising:
an oscillation circuit configured to generate and provide an oscillating signal;
a first biasing circuit configured to derive a bias current signal in accordance with a control signal and to apply the bias current signal to the oscillation circuit;
a reference generating circuit configured to generate a reference voltage signal, and comprising a second biasing circuit configured to derive a reference bias current signal in accordance with the control signal;
a comparison circuit configured to receive directly at least a voltage signal observed at an output of the first biasing circuit, and wherein the comparison circuit is configured to determine an error signal by comparing the voltage signal observed at the output of the first biasing circuit with the reference voltage signal observed at an output of the second biasing circuit, the voltage signal being indicative of an amplitude level of the oscillating signal and the reference voltage signal being indicative of a desired oscillator amplitude; and
a controller configured to determine the control signal from the error signal and provide the control signal to the first biasing circuit and the second biasing circuit, wherein the bias current signal can be adjusted to control the amplitude level of the oscillating signal.

2. The oscillator device of claim 1, wherein the oscillation circuit comprises a resonant tank.

3. The oscillator device of claim 1, wherein the first biasing circuit and the second biasing circuit comprise a current source.

4. The oscillator device of claim 1, wherein a first rail voltage is applied to the oscillation circuit.

5. The oscillator device of claim 4, wherein a second rail voltage is applied to the first biasing circuit.

6. The oscillator device of claim 1, further comprising an interfacing circuit configured to receive the control signal and provide an adapted control signal to at least the first biasing circuit.

7. The oscillator device of claim 1, wherein the controller is configured to run a control algorithm.

8. The oscillator device of claim 7, wherein the control algorithm is a PID control algorithm.

9. The oscillator device of claim 1, further comprising an analog-to-digital converter for digitizing the error voltage signal and a digital-to-analog converter for converting the control signal.

10. The oscillator device of claim 1, further comprising a low-pass filter for filtering the voltage signal.

* * * * *